(12) United States Patent
Zimmerman et al.

(10) Patent No.: US 8,039,945 B2
(45) Date of Patent: Oct. 18, 2011

(54) PLASTIC ELECTRONIC COMPONENT PACKAGE

(75) Inventors: Michael A. Zimmerman, North Andover, MA (US); Keith Smith, Methuen, MA (US); Jacob Shverdin, Swampscott, MA (US)

(73) Assignee: Interplex QLP, Inc., College Point, NY (US)

( * ) Notice: Subject to any disclaimer, the term of this patent is extended or adjusted under 35 U.S.C. 154(b) by 0 days.

(21) Appl. No.: 12/950,528

(22) Filed: Nov. 19, 2010

(65) Prior Publication Data

US 2011/0064881 A1    Mar. 17, 2011

Related U.S. Application Data

(62) Division of application No. 12/220,543, filed on Jul. 25, 2008, now abandoned, which is a division of application No. 12/001,792, filed on Dec. 12, 2007.

(60) Provisional application No. 60/874,450, filed on Dec. 12, 2006.

(51) Int. Cl.
*H01L 23/48* (2006.01)

(52) U.S. Cl. ............ 257/690; 257/E33.056; 438/106

(58) Field of Classification Search .......... 257/690, 257/E33.056; 438/106
See application file for complete search history.

(56) References Cited

U.S. PATENT DOCUMENTS

| | | |
|---|---|---|
| 4,288,081 A | 9/1981 | Sado |
| 4,880,591 A | 11/1989 | Baba |
| 5,122,862 A | 6/1992 | Kajihara et al. |
| 5,529,959 A | 6/1996 | Yamanaka |
| 5,586,214 A | 12/1996 | Eckman |
| 5,691,689 A | 11/1997 | Smith et al. |
| 6,313,525 B1 | 11/2001 | Sasano |
| 6,455,774 B1 | 9/2002 | Webster |
| 6,525,405 B1 | 2/2003 | Chun et al. |
| 2003/0124393 A1 | 7/2003 | Shibata et al. |
| 2004/0207056 A1 | 10/2004 | Seki et al. |
| 2004/0245590 A1 | 12/2004 | Hsieh et al. |
| 2005/0016750 A1* | 1/2005 | Zimmerman ............ 174/52.3 |

FOREIGN PATENT DOCUMENTS

JP        2001210776 A  *  8/2001

* cited by examiner

*Primary Examiner* — Thao Le
*Assistant Examiner* — Matthew Gordon
(74) *Attorney, Agent, or Firm* — Weingarten, Schurgin, Gagnebin & Lebovici LLP (57) ABSTRACT

A plastic package for an image sensor or other electronic component which comprises a plastic body, preferably of LCP material, molded around a leadframe and defining a cavity in which the image sensor is to be disposed. A lid assembly is provided having a transparent glass lid retained in a plastic lid frame which is weldable or otherwise bondable to the plastic body of the package to enclose the image sensor mounted in the cavity. The leadframe is usually composed of copper or a copper alloy, or a ferrous alloy having a copper coating. An interfacial layer is formed on the surfaces of the leadframe at least in those portions which are in contact with the plastic body which serves to provide substantially improved adhesion between the leadframe and the plastic material to achieve a hermetic bond between the metal and plastic materials. The interfacial layer is composed of a cuprous oxide base layer formed on a surface of the leadframe, and a cupric oxide layer formed on the cuprous oxide layer. The cupric oxide outer layer has an acicular structure which provides an interlocking mechanism for adhesion to the plastic material molded thereto in forming the package.

21 Claims, 9 Drawing Sheets

PLASTIC ELECTRONIC COMPONENT PACKAGE

CROSS REFERENCE TO RELATED APPLICATIONS

The present application is a divisional application of U.S. application Ser. No. 12/220,543 filed Jul. 25, 2008 entitled PLASTIC ELECTRONIC COMPONENT PACKAGE, which is a divisional application of U.S. Application No. 12,001,792, filed Dec. 12, 2007 and entitled PLASTIC ELECTRONIC COMPONENT PACKAGE, which claims the benefit under 35 U.S.C. §119(e) of U.S. Provisional Patent Application No. 60/874,450, filed Dec. 12, 2006. Each of the aforementioned related applications is hereby incorporated by reference in its entirety.

STATEMENT REGARDING FEDERALLY SPONSORED RESEARCH OR DEVELOPMENT

N/A

BACKGROUND OF THE INVENTION

Image sensors such as those used in digital cameras and other optical or image sensing equipment are conventionally housed in a ceramic package. The ceramic package includes a ceramic frame which is epoxy bonded to a glass lid or cover. The ceramic package is expensive and not readily adapted to manufacture in strip form or other multiple unit form, as is widely employed in the semiconductor packaging industry. In addition, the use of epoxy as a bonding agent presents several problems such as moisture penetration through the epoxy bond, outgassing of the epoxy which can contaminate the semiconductor device, and air leakage which limits the ability to hermetically seal the ceramic package. Further, it is difficult to accurately align the glass cover to the ceramic frame so that the glass cover is parallel to the image sensor surface. This alignment difficulty is caused by an inability to control the thickness of an epoxy bead which is commonly employed to seal the glass lid to the ceramic frame.

Figure 1:
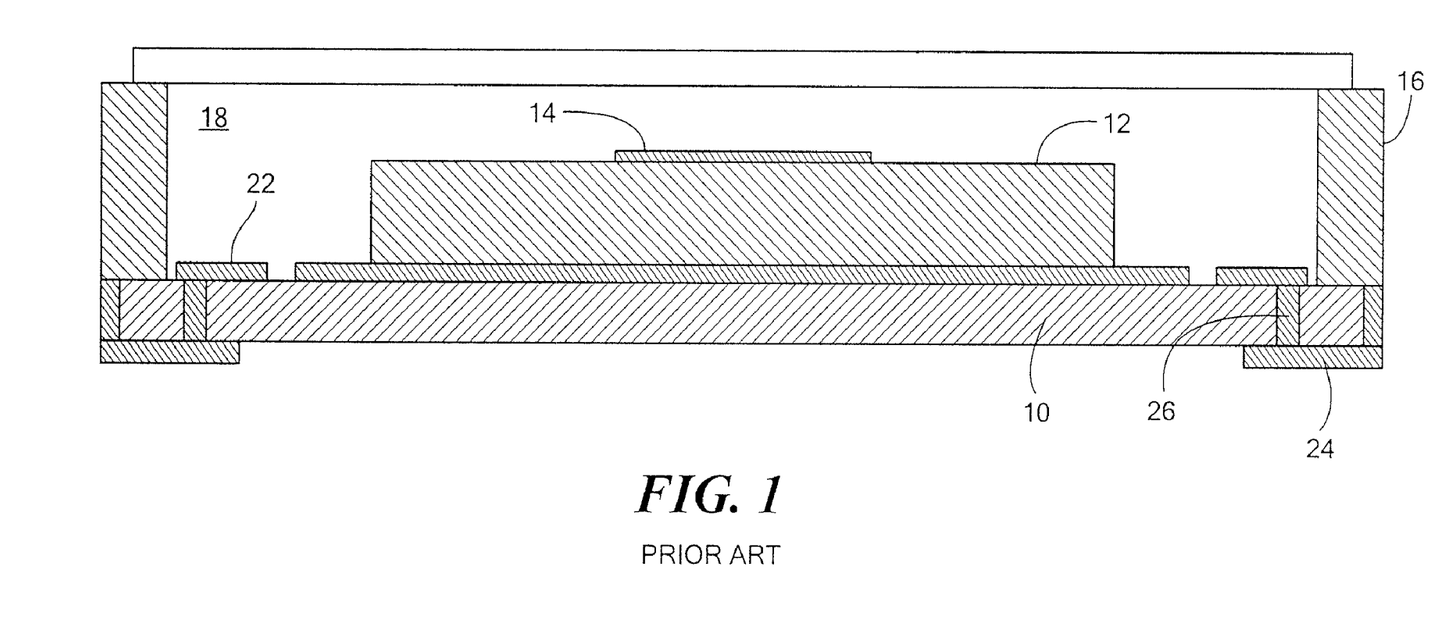
FIG. 1 is a cutaway elevation view of a ceramic package of conventional construction.

A conventional ceramic sensor package is shown in sectional elevation view in FIG. 1. This package includes a two layer ceramic substrate composed of an outer ceramic substrate 10 and an inner ceramic substrate 12, on the upper surface of which is disposed a CCD or CMOS image sensor 14. A ceramic frame 16 defines the cavity 18 in which the image sensor is located. The ceramic frame is hermetically sealed to the peripheral surface of the substrate 10 and a boro-silicate glass lid or window 20 is sealed to the upper surface of frame 16 by a UV curable adhesive. The contacts of the image sensor are wire bonded to contacts 22 provided on the inner surface of substrate 10. These contacts 22 are electrically connected to outer contact pads 24 by conductive feedthroughs or vias provided in substrate 10. The feedthroughs 26 are typically plated with gold to enhance the electrical conduction between the inner and outer contact areas. A UV curable adhesive is usually employed to bond the glass window to the ceramic package frame to prevent exposure of the semiconductor sensors to high temperatures which are needed to cure other types of epoxy adhesives but which can degrade or destroy the semiconductor sensors. The requirement for UV curable adhesive materials limits the range of available epoxies which can be employed in the conventional ceramic package, since most epoxy adhesives are curable at elevated temperatures.

The reliability of semiconductor and other electronic device or component packages including image sensor packages is related to the "airtightness" or hermeticity of the package. Hermeticity is a measure of an ability of the package to protect the semiconductor or other device housed in the package from an entrance of fluids and moisture. Moisture or corrosive gases on or near a semiconductor device can cause corrosion of the metallic traces on the semiconductor device, and can lead to failure. Traditional hermetic packages are made from metal, ceramic, or vitreous materials. These materials have such low permeabilities that moisture and fluids typically are impeded by these materials, and cause a condensation on the semiconductor device or contamination by corrosive gasses.

In addition to a permeation of fluids or moisture, fluids or moisture can penetrate the image sensor package though "leaks" at several interfaces. The interfaces for a ceramic package include a metal/ceramic interface, along with epoxy/glass and epoxy/ceramic interfaces. Any small openings at these interfaces allow fluids or moisture to seep inside the image sensor package.

BRIEF SUMMARY OF THE INVENTION

The image sensor package according to the present invention eliminates the need for ceramic components and employs a plastic material which preferably is a high temperature liquid crystal polymer (LCP) material. The package is useful not only for image sensors but also for other light sensing or light emitting semiconductor or other devices or components. A package in accordance with the invention can also be used to contain non-optical devices or components.

The image sensor package comprises a plastic body or frame, preferably of LCP material, molded around a metal leadframe and defining a cavity in which the image sensor is to be disposed. The leadframe has a central portion in the cavity on which the image sensor is mounted, and a plurality of leads which are connectable to contact areas of the sensor. A lid assembly is provided having a transparent glass lid retained in a lid frame which is also made of plastic, preferably LCP material. The lid frame is weldable or otherwise bondable to the plastic frame of the package to enclose the image sensor mounted in the cavity. The leadframe is usually composed of copper or a copper alloy, or a ferrous alloy having a copper coating. An interfacial layer is formed on the surfaces of the leadframe at least in those portions which are in contact with the plastic frame. This interfacial layer serves to provide substantially improved adhesion between the leadframe and the plastic material and to achieve a hermetic bond between the metal and plastic materials. The interfacial layer is composed of a cuprous oxide base layer formed on a surface of the leadframe, and a cupric oxide layer formed on the cuprous oxide layer. The cupric oxide outer layer has an acicular structure which provides an interlocking mechanism for adhesion to the plastic material molded thereto in forming the package.

In another aspect of the invention a hermetic seal and sealing technique is provided between a metal element and a plastic element which utilizes an interfacial or intermediate layer between the metal element and plastic element and which comprises a first oxide base layer for providing strong adhesion to the metal material and a second oxide layer formed on the first oxide base layer and having an acicular structure for strong adhesion to the plastic material.

BRIEF DESCRIPTION OF THE SEVERAL VIEWS OF THE DRAWINGS

The invention will be more fully described in the following detailed description taken in conjunction with the accompanying drawings in which.

DETAILED DESCRIPTION OF THE INVENTION

The package, materials and method of package fabrication are described in a preferred embodiment for an image sensor. The invention is not to be limited to image sensor packages or packages for other optical devices, but is more broadly useful for housing other semiconductor, electrical and electronic devices, components or circuits.

The package configuration can be of various forms to suit particular packaging requirements. The package configuration may vary in size and shape and can include electrical lead configurations of many different forms. The invention is not to be limited to any particular package type or configuration. The invention will be described in the context of a package for a semiconductor image sensor chip such as used in digital cameras and other digital imaging systems and devices.

The image sensor package in accordance with the invention comprises a high temperature thermoplastic body or frame, preferably an LCP material, molded around a metal leadframe. An image sensor chip is mounted in a cavity of the package on a central portion of the leadframe and the chip is wirebonded or otherwise connected to leads of the leadframe. A lid assembly comprised of a glass lid retained in a high temperature thermoplastic frame, also preferably an LCP material, is attached to the package frame after the sensor chip has been mounted in the cavity of the package. The frame of the lid assembly is ultrasonically welded to the plastic frame of the image sensor package to provide a hermetically sealed enclosure for the sensor. The glass lid is chemically bonded to the plastic frame of the lid assembly, preferably by thermal bonding. Alternatively, the glass lid can be insert molded to the lid assembly frame. The glass is of optical quality and is transmissive in the optical spectrum of interest. For a photographic sensor, the glass is transmissive to the visible light spectrum. For other purposes, such as for certain LED packages, the glass is transmissive to UV light.

Figure 2A:
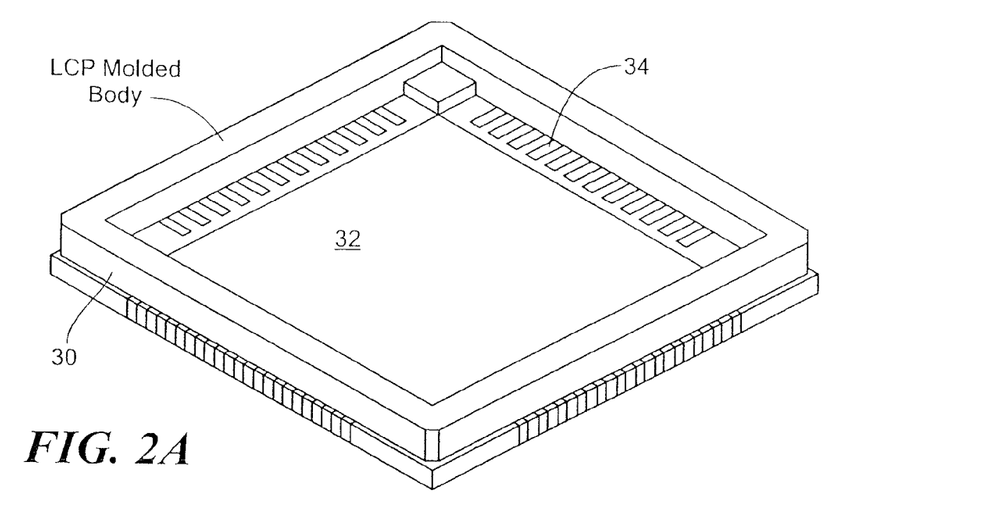
FIG. 2A shows an image sensor package made in accordance with the invention.
Figure 2B:
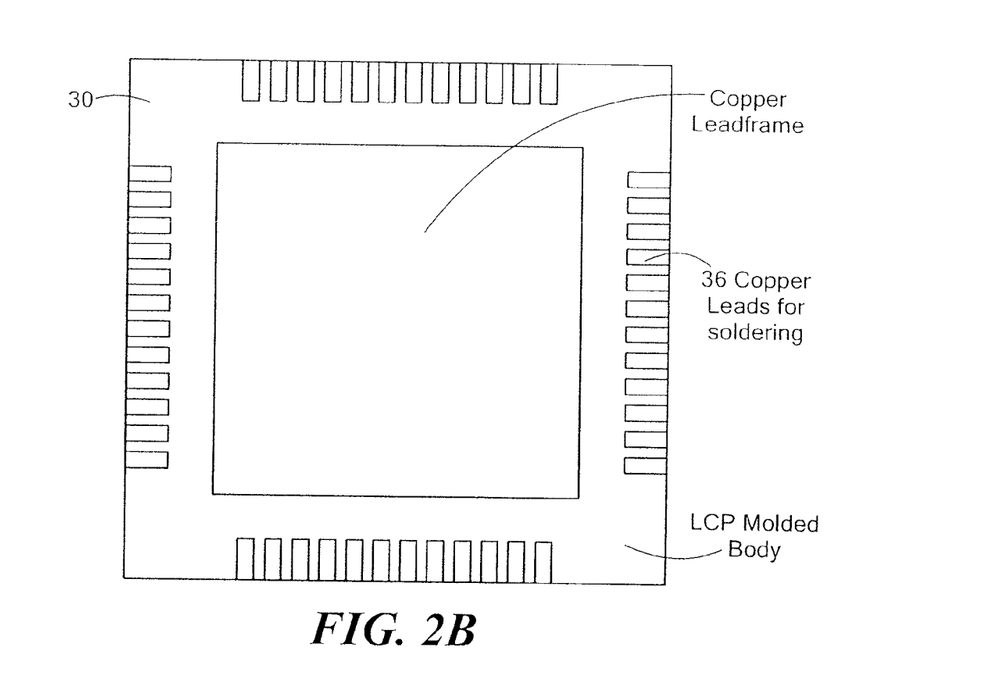
FIG. 2B shows the bottom of the package of FIG. 2A.

An image sensor package according to the invention is shown in pictorial view in FIG. 2A and bottom view in FIG. 2B. The plastic frame or body 30 defines a cavity area in which the image sensor is mounted on the copper surface 32 provided by the leadframe. Copper leads 34 provided about the periphery of the cavity extend through the molded body to positions 36 on the bottom of the leadframe as shown in FIG. 2B.

A leadframe is fabricated of copper or copper alloy using conventional methods (e.g., etching or plating). For reasons of cost and manufacturing ease, the leadframe is usually fabricated in a reel. The leadframe is exposed to a treatment, described below, to improve adhesion for molding with the plastic material. This treatment can be performed in either reel-reel or strip format.

Figure 3:
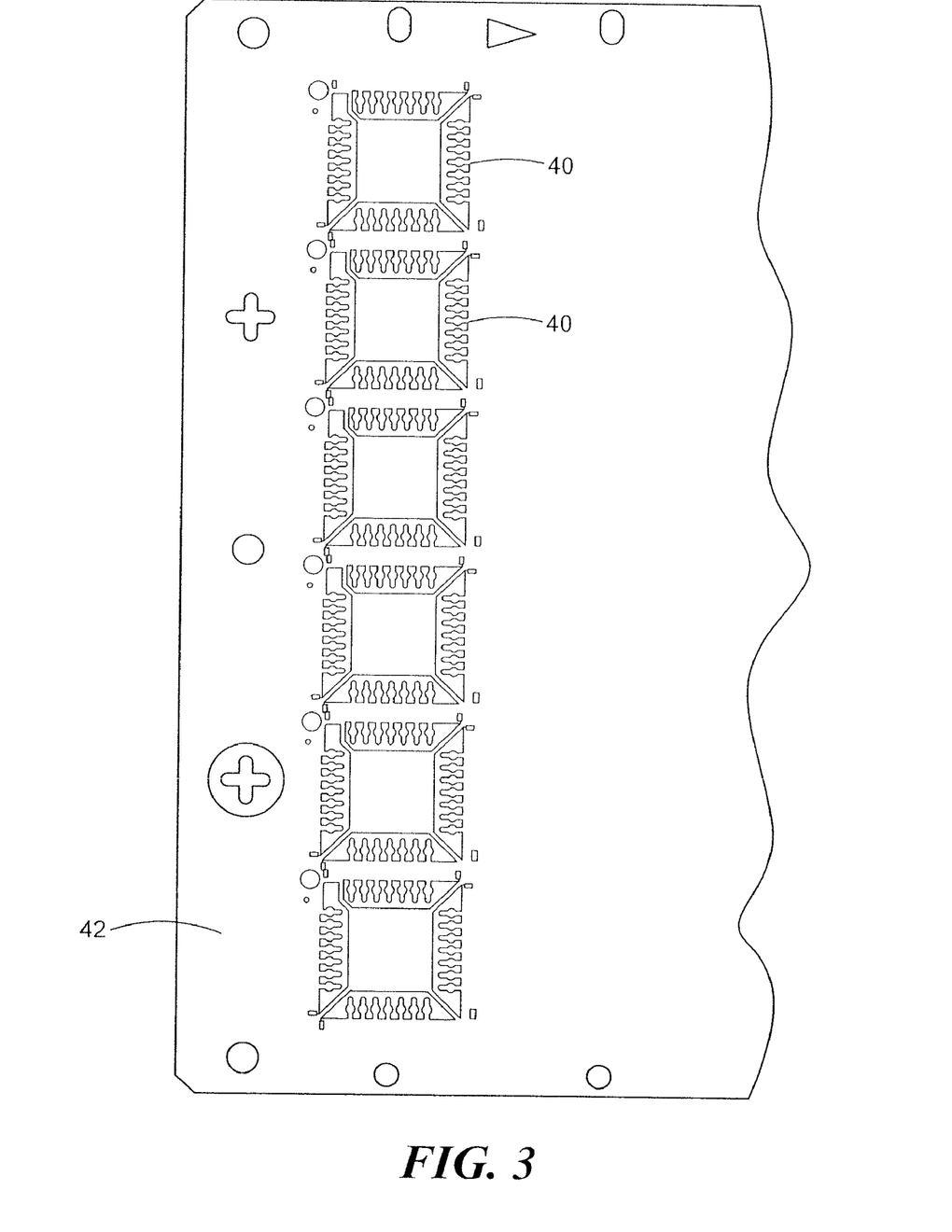
FIG. 3 shows a leadframe strip used in the package of the invention.

A portion of a leadframe strip is shown in FIG. 3 in which six leadframe units 40 are disposed across the width of the strip 42. In one embodiment, six package bodies are molded simultaneously across the width of the leadframe strip. The leadframe strip is then advanced, and an additional six bodies are molded to the array of leadframes disposed across the width of the strip. In similar manner, the leadframe strip is populated with package bodies and the strip is wound onto a continuous reel. Alternatively, the reel can be separated into strips of intended length and width to suit user requirements. In a further alternative, the package bodies molded to each leadframe unit are separated or singulated into individual units which are then supplied to a user for use in packaging the sensor.

Figure 4A:
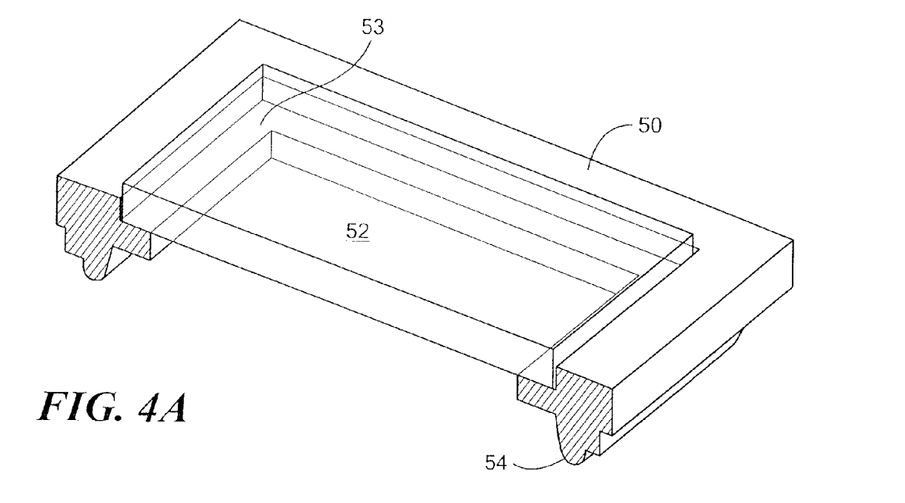
FIG. 4A is a cutaway perspective view of the lid assembly.
Figure 4B:
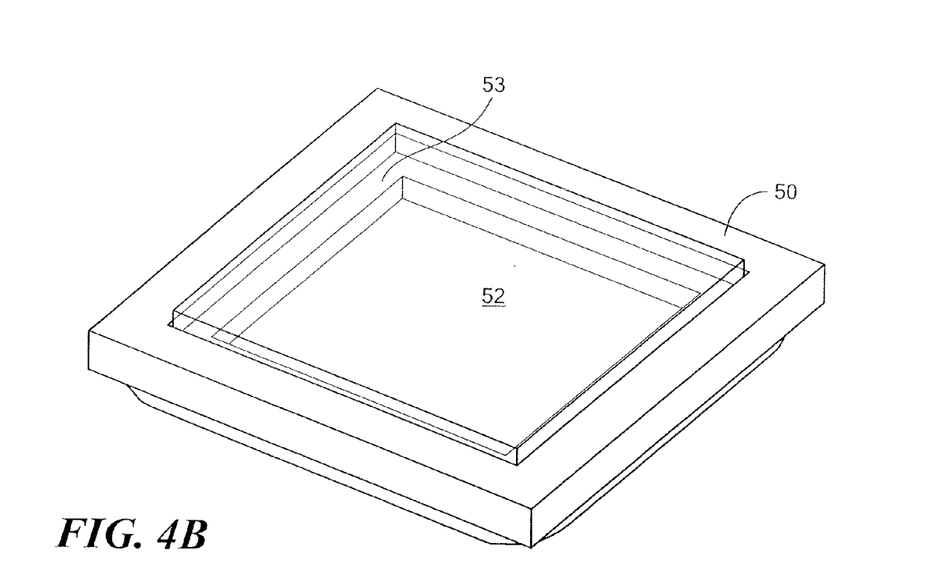
FIG. 4B is a perspective view of the lid assembly.
Figure 4C:
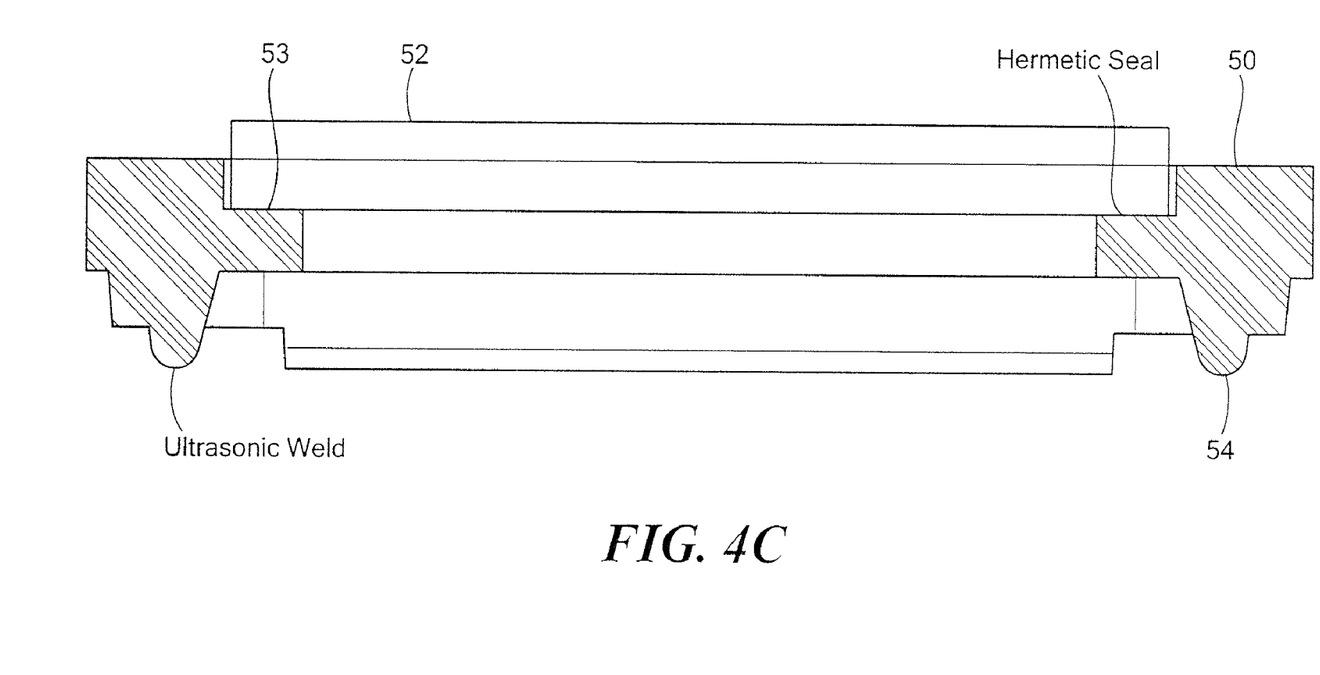
FIG. 4C is a cutaway elevation view of the assembly of FIG. 4A.
Figure 5:
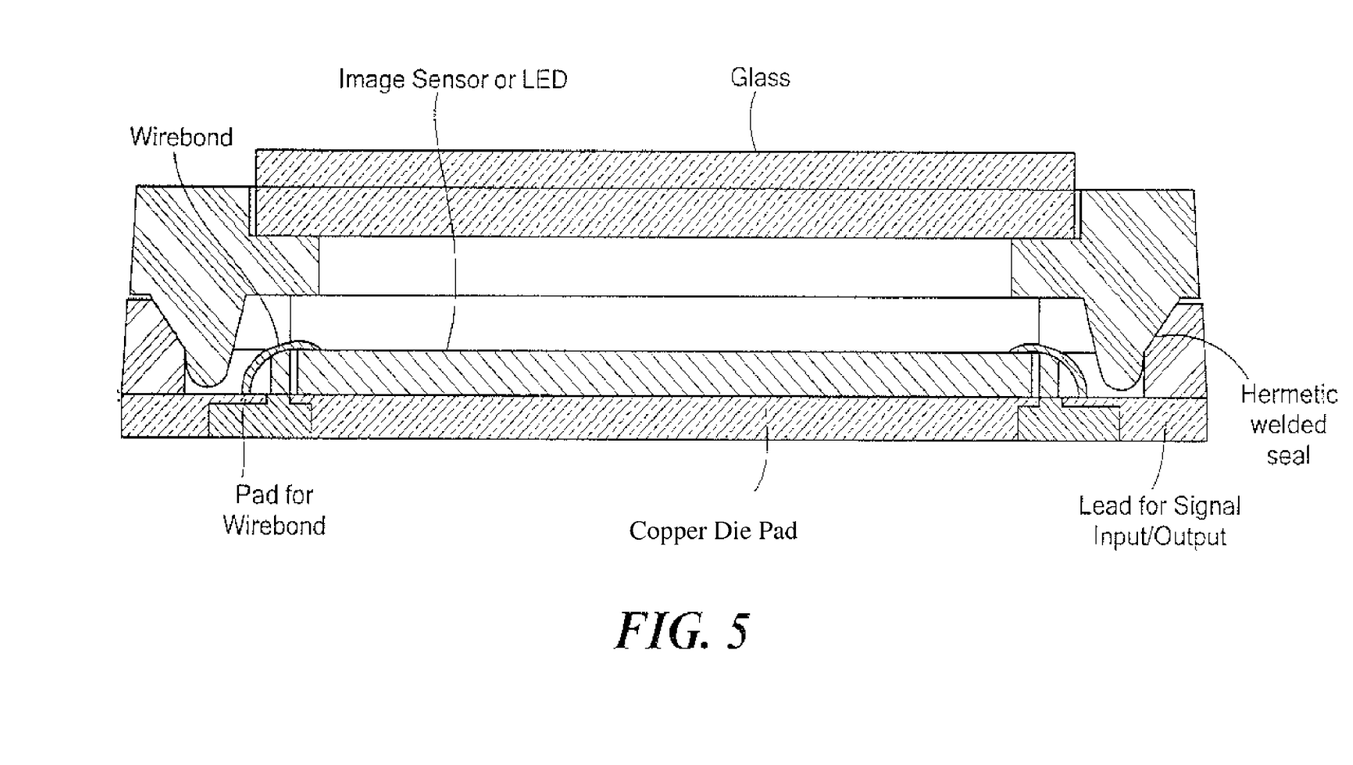
FIG. 5 is a cutaway elevation view of the ultrasonically welded image sensor package.

The lid assembly is shown in FIGS. 4A-4C. The lid assembly comprises a high temperature plastic frame 50, preferably an LCP material. A glass lid 52 is chemically bonded to the plastic frame 50 preferably by thermal bonding to provide a hermetic seal between the glass lid and plastic frame. The glass lid is preferably a boro-silicate glass of optical quality to provide appropriate light transmission to the image sensor housed within the package. The frame 50 has a recessed shelf area as shown in which the lid 52 is disposed. The lid is bonded to the shelf 53. The plastic frame has a peripheral configuration 54 which is complementary to a configuration provided about the periphery of the plastic frame of the package, as seen in FIG. 5. The lid assembly is ultrasonically welded at these mating configurations of the lid frame and package frame to provide an ultrasonic seal. The sealed package with the lid assembly bonded to the package frame or body is shown in FIG. 5.

The leads are preferably made of an alloy of copper including iron in a range between about 2.1% and about 2.6%, phosphorus in a range between about 0.015% and about 0.15%, zinc in a range between about 0.05% and about 0.2%, with the balance being copper. Other combinations of these materials are, however, acceptable. The leads are more preferably made of about 97.5% copper, about 2.35% iron, about 0.3% phosphorus and about 0.12% zinc. Such an alloy is available from Olin Corporation under the UNS designation C19400.

Alternatively, the leads can be made of a ferrous alloy such as alloy 42 which is a nickel-iron alloy. Copper is plated onto the surfaces of the leadframe prior to molding of the plastic body or frame to the leadframe.

The package body or frame is a thermoplastic material which preferably is a high temperature liquid crystal polymer (LCP) material. The plastic frame of the lid assembly is also preferably an LCP material. For many applications, the package body is composed of a Type I LCP material which has a relatively high melting temperature in the range of 300-350° C. This high temperature material is beneficial to withstand the temperatures employed for gold-tin die-attach which is often used for attachment of the image sensor chip to the copper substrate of the package. For other applications, such as for lead free solder die-attach, a Type II LCP material can be used which has a melting temperature in the range of about 280-320° C.

The LCP composition includes filler particles which are added for dimensional stability, adjustment of coefficient of thermal expansion (CTE), adjustment of anisotropy, lower permeability, attaining a small particle size to reduce contamination by dust, and optimizing their hermetic sealing. The filler particles can include talc, glass, graphite, titanium dioxide, calcium carbonate, mica, boron nitride, quartz, and fused silica. The particles may be in the form of nanospheres, or platy structures which are of flat plate-like configuration. A blend of such particles forms may also be employed. In one composition, the filler particles are talc in the form of a 50% blend of platy structures and nanospheres. The talc particles may be less than 1 micron in diameter or width or may be in a larger size range of about 1-3 microns. The platy structure of the particles interacts with the LCP molecules to provide some "bending" in the molecule which helps decrease anisotropy. Talc in the range of about 30-50% by weight in the LCP composition is one preferred range to optimize the CTE of the material. Preferably the CTE of the LCP material should be in the range of about 6 ppm/° C.-25 ppm/° C. to be compatible with the CTE of the leadframe. The filler particles of nano size are useful in enhancing the hermetic sealability of the material to the leadframe. In another composition, glass is used in various combinations of geometrical sizes, including fibers, milled glass, and flakes.

The frame of the lid assembly is also preferably an LCP material having filler particles preferably in the range of about 10-30% by weight.

Examples of LCP material compositions are shown in Table 1.

TABLE 1

| Sample | Polymer | Talc % | Glass Fiber % | Milled Glass % | Flake Glass % |
|---|---|---|---|---|---|
| 1 | Polymer | 10-40% | | | |
| 2 | Polymer | 30 | 10 | | |
| 3 | Polymer | | | 45 | |
| 4 | Polymer | | 10 | 35 | |
| 5 | Polymer | | | 15 | 15 |
| 6 | Polymer | | | 20 | 20 |
| 7 | Polymer | | | 25 | 25 |

Polymer Composition
Thermotropic LCP Containing the following repeat units
hydroquinine (HQ)
teraphalic acid
isophalic acid
2,6 naphalene
dicarboxyclic acid
4-hydrobenzoic acid (HBA)
bisphenol or biphenol (BP)
hydroxynaphthoic acid
Talc = magnesium silicate hydroxide, pophyllosilicate
Glass Fibers = sio2, CaO, Al2O3, B2O3, length 4000-13,000 microns
Milled glass (same composition) 50-350 microns
Flaked glass (same composition)

In order to enhance the adhesion of the leadframe to the LCP package frame and to provide better hemeticity, an interfacial or intermediate layer is provided on the surfaces of the leadframe at least in the areas of the leadframe to which the plastic material is to be molded. This interfacial layer is composed of two sub-layers; namely, a base layer of cuprous oxide formed on the leadframe or intended portions thereof, and a cupric oxide layer formed on the cuprous oxide layer. The cupric oxide outer layer has an acicular, dendritic or needle like structure which provides an interlocking mechanism for adhesion to the plastic material molded thereto in forming the package. Typically, the entire leadframe is coated prior to molding with the interfacial material. After molding of the frame to the leadframe, the exposed portions of the intermediate layer material outside the areas of the molded package body are removed.

The interfacial layer is provided by a chemical conversion process by which the copper surfaces of the leadframe are oxidized under process conditions which allow the cuprous oxide base layer and cupric oxide outer layer to form. Under the appropriate conditions, the cuprous oxide and cupric oxide layers grow or form substantially simultaneously. An oxidizing material is employed such as a chemical oxidizer which has been modified by the addition of an alkaline solution of, for example, sodium chloride in an amount to provide a reaction temperature which is greater than about 125° F. The reaction time and temperature after application of the oxidizing material to the leadframe determines the growth of the two interfacial layers. The reaction time is greater than about ten minutes. In one embodiment, the reaction time after exposure of the leadframe to the oxidizing solution is about twenty minutes at a temperature of about 212-216° F. The leadframe is typically immersed in a bath of oxidizing solution to provide the interfacial layer.

The interfacial layer has a thickness in the range of about 1-10 microns. The base layer is thinner than the cupric oxide layer in a ration of about 1:5, although this range can vary under various process conditions. The oxide material is of high density and has high adhesion strength to the copper on which it is formed. This dual oxide layer serves to relieve stress in the interfacial layer and can withstand temperatures of at least 400° C. to avoid cracking or other degradation of the oxide which could otherwise occur during molding of the package body to the leadframe or by die-attach temperatures which may be employed in attaching the image sensor or other chip to the package mounting surface. The acicular structure of the cupric oxide coating typically has a random pattern. The cupric oxide also provides protection for the underlying cuprous oxide layer which is in contact with the copper. Such protection is by shielding the underlying layer from damage by hot temperatures which are present in molding the package and during die attach, and which can cause degradation of the copper/oxide interface.

The plastic package body molded to the leadframe which has been provided with the interfacial layer achieves a moisture resistant and hermetically sealed bond between the plastic body and the leadframe. The subsequent bonding of the lid assembly to the package body, after installation of the image sensor in the package cavity, also provides a moisture resistant and hermetically sealed bond between the package body and lid assembly thus resulting in a hermetically sealed package.

Figure 6:
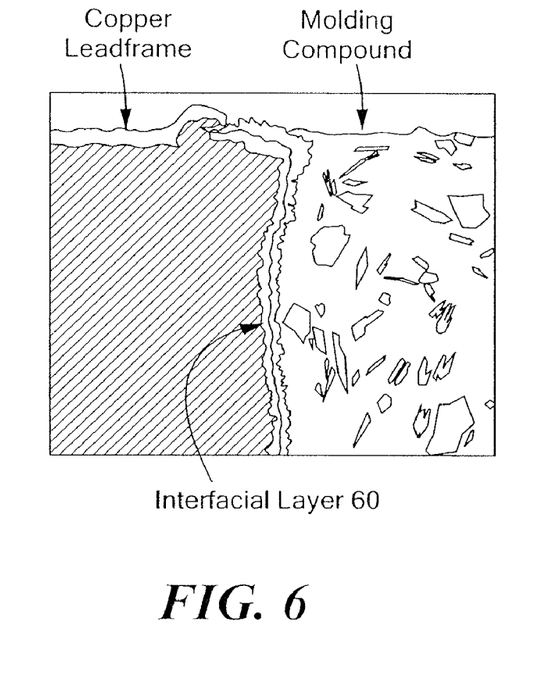
FIG. 6 are photomicrographs showing the interfacial layer between the copper leadframe and package frame material.

The interfacial layer 60 is seen in the photomicrographs of FIG. 6 which shows cross-sections of the LCP package body material bonded to the copper leadframe. The interfacial layer, composed of the cuprous oxide layer formed on the copper surface and the cupric oxide layer formed on the cuprous oxide base layer, has the following properties and benefits. The cuprous oxide forms a strong bond to the copper leadframe and is resistant to delamination. The acicular topography of the cupric oxide reduces surface tension to promote wetting of the LCP for adhesion and enhanced surface roughness for increasing the surface area for bonding of the LCP material. The cupric oxide also provides an inert top surface which impedes contamination and an inorganic low permeability material for moisture resistance.

Figure 7:
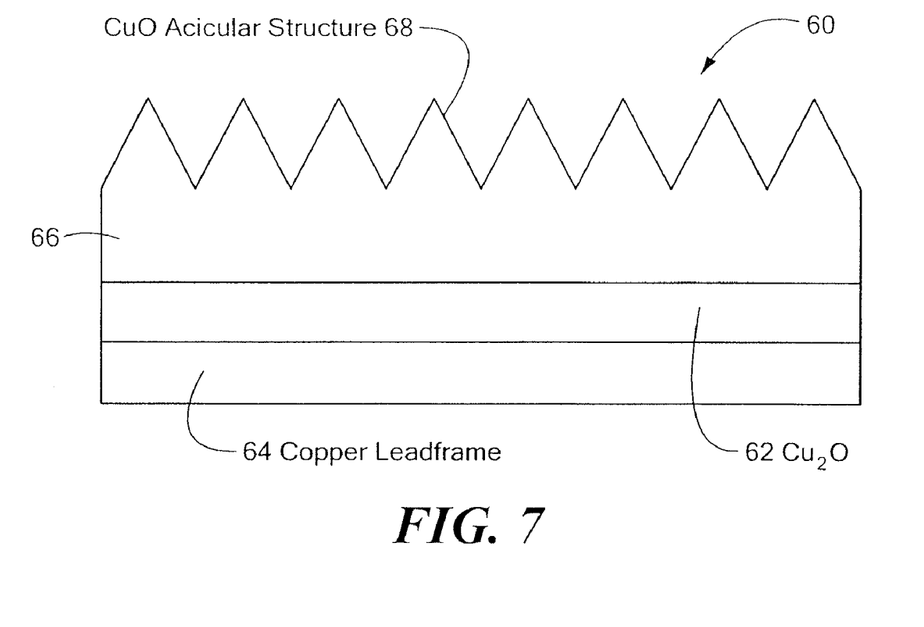
FIG. 7 is a diagrammatic elevation view of the interfacial layer.

The interfacial layer 60 is illustrated in the diagrammatic view of FIG. 7 and shows a cuprous oxide base layer ($Cu_2O$) 62 for strong adhesion to copper leadframe 64, and cupric oxide layer (CuO) 66 having an acicular or dendritic structure 48 and which is molded to the LCP package material.

As stated above, the layer can be provided by a chemical conversion process, which can be implemented in a standard in-line bath. The leadframe can typically be in rack or reel-reel format.

This interfacial layer can be used with ferrous metals and alloys, as well as the copper described above. Such an interfacial layer can also be used as an interface between other metal and thermoplastic materials. By use of this interfacial layer, a metal element can be hermetically sealed to a thermoplastic element for a variety of purposes in which a hermetic seal is required between the metal and plastic components. One such purpose is for hermetically sealed electronic packages as described herein, but is more broadly useful for a variety of electrical, electronic, mechanical and other structures where a hermetic or near hermetic seal is desired between metal and plastic materials.

Figure 8A:
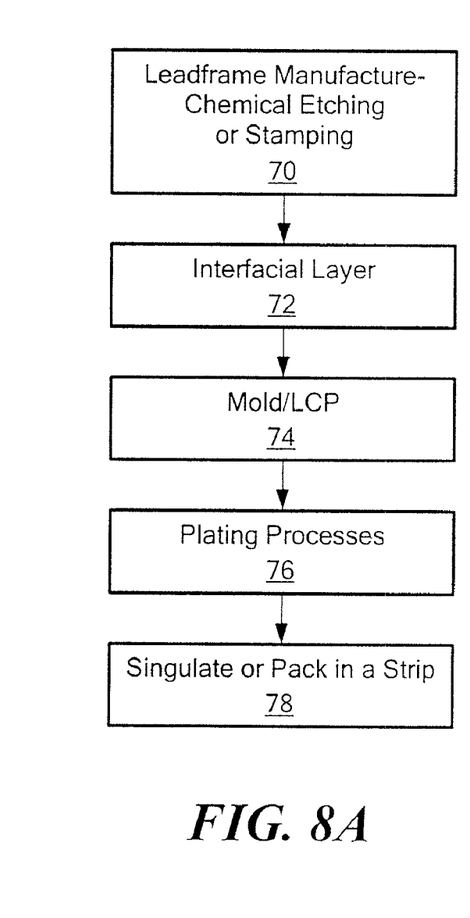
FIG. 8A is a flowchart illustrating the steps of package fabrication.

FIG. 8A shows the steps of making the image sensor package. The leadframe is made by stamping or chemical etching in step 70. An interfacial layer is formed on the leadframe in step 72, at least in the portions to be molded to the LCP material. The LCP material is molded to the leadframe in step 74 to create the package cavity. The leadframe is plated in intended portions, such as the leads thereof, in step 76. In step 78, the image sensor package may be singulated into individual pieces or packed in a strip or reel form.

Figure 8B:
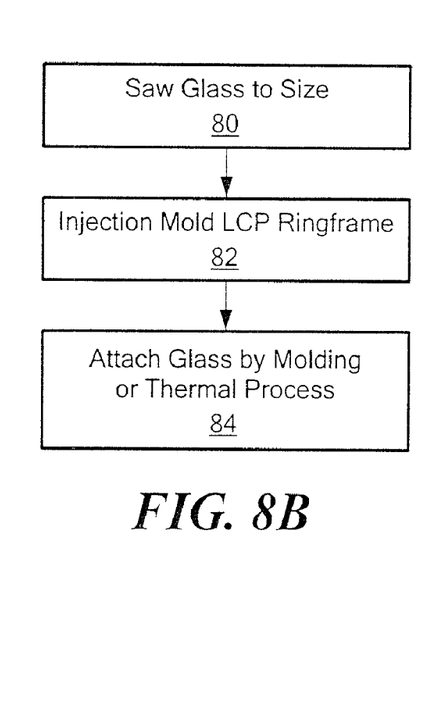
FIG. 8B is a flowchart illustrating the steps of lid assembly fabrication.

The fabrication of the lid assembly is shown in FIG. 8B. A piece of glass is sawed or otherwise cut to a desired size in step 80. A ringframe of LCP material is made by injection molding in step 82. The glass lid is attached to the ringframe by a process of thermal attachment, such as thermal bonding in step 84. The lid may be attached to the lid frame by other techniques, such as insert molding.

Figure 9:
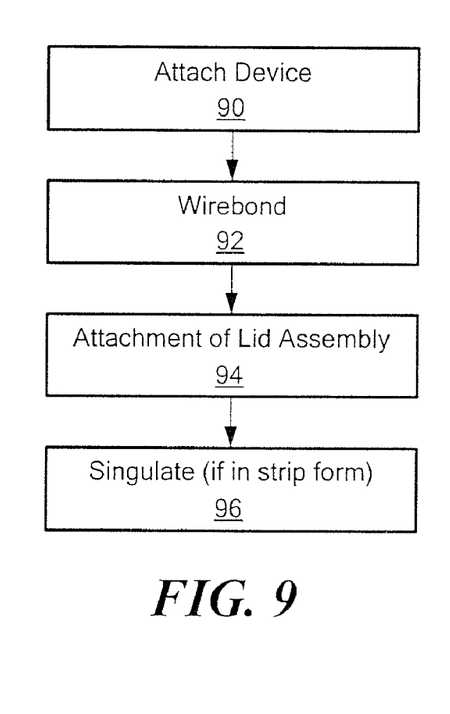
FIG. 9 is a flowchart of the steps typically employed by a manufacturer in attaching a device in the package.

FIG. 9 shows the steps a customer, or an end-user, may take for mounting an image sensor device in the image sensor package. In step 90, the device is bonded to the copper mounting surface of the package cavity. The device contacts are wirebonded to potential contacts of the package, in step 92. The lid assembly is attached to the package frame such as by ultrasonic welding in step 94. The completed package is singulated in step 96, if fabrication was in strip form.

The package constructed in accordance with the invention achieves a hermeticity which is comparable to conventional and more expensive ceramic packages. The performance of the present invention in meeting stringent hermeticity requirements is described below.

The traditional method of evaluating the hermeticity of a cavity package is by performing a helium leak test (MIL-STD-883). In this test, a sealed package is placed in a helium pressurized vessel (termed "bomb"). Some helium will enter the cavity package though one of the "leak" channels. After removal of the cavity package from the bomb, the cavity package is connected to a helium leak tester, and the leak rate of the cavity package is detected. The amount of helium released depends upon the size of the "leak" channel and the helium pressure within the cavity package. The helium pressure in the cavity package depends upon the amount of helium and the internal volume of the cavity package. The levels of hermeticity are governed by MIL-STD-883 test condition 1014. The following are the hermetic rating and test methods:

(i) Test Condition A: Fine Leak using helium tracer gas:
A1: Fixed Method
A2: Flexible Method
A4: Open Can Leak for Unsealed Packages (ii) Test Condition B: Fine Leak using Radioactive Tracer Gas (iii) Test Condition C: Gross Leak and Fine Leak Test Techniques
C1: Gross Leak Bubble Test
C3: Gross Leak Vapor test
C4/C5: OLT Optical Leak Detection (Gross and Fine Leak)

(iv) Test Condition D: Gross Leak using a Dye Penetrant (Destructive)

(v) Test Condition E: Gross Leak by Weight Gain Measurements

To be designated as a hermetic package, the helium leak rates of a cavity package must meet the following criteria shown in Table 2:

TABLE 2

Helium Leak Rates and Hermetic Ratings

| Package Volume, (cc) | Maximum Leak Rate, (atm-cc/sec) |
|---|---|
| <=.01 | $5 \times 10^{-8}$ |
| 0.01 < V <= 0.4 | $1 \times 10^{-7}$ |
| >0.4 | $1 \times 10^{-6}$ |

The flow of helium and other gases through a fine leak is molecular because of the fine leak channel. The number of molecules striking a unit area of surface is proportional to the pressure of the gas and inversely proportional to the square root of its molecular weight. Below in Table 3 are the properties of several molecular species (gasses) of interest for the image sensor package, as it is desirable to protect the image sensor package from such molecular species:

TABLE 3

Properties of Gases

| Molecular Species | Molecular Weight (Gram) | Diameter ($\times 10^{-8}$ cm) | Viscosity Micro-Poise @ 20 Celsius | Molecular Mass ($\times 10^{-24}$ Gram) |
|---|---|---|---|---|
| Helium | 4.0 | 2.2 | 194 | 6.64 |
| Neon | 20.2 | 2.6 | 311 | 33.5 |
| Argon | 40.0 | 3.7 | 222 | 66.2 |
| Nitrogen | 28.0 | 3.8 | 177 | 46.5 |
| Oxygen | 32.0 | 3.6 | 202 | 53.1 |
| Air | 28.7 | 3.7 | 184 | 47.6 |
| Water | 18.0 | 3.2 | 125 @ 100 Celsius | 29.9 |
| Carbon Dioxide | 44.0 | 4.6 | 148 | 73.0 |

For an image sensor package to be compliant with MIL-STD-883D testing, leakage due to openings at an interface should be small.

For the image sensor package to pass the Gross Leak Test Condition C1: MIL-STD-883, the following applies:
Helium Leak Rate<=$1 \times 10^{-5}$ atm-cc/sec and
Leak channels with a cross sectional dimension greater than $1 \times 10^{-4}$ cm will cause the image sensor package to fail this test.

Figure 10:
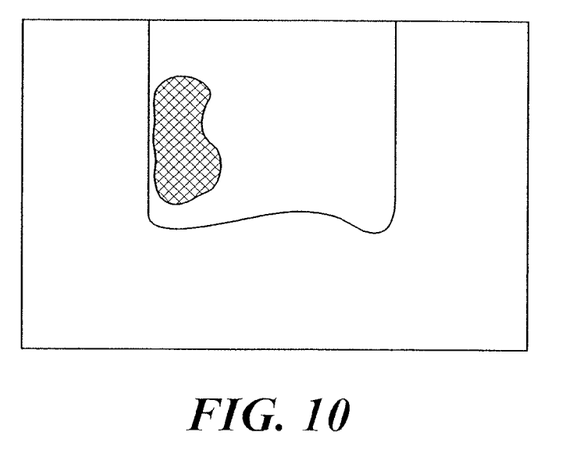
FIG. 10 is a photomicrograph illustrating dye leaking through a conventional LCP package which is non-hermetic.

FIG. 10 shows the interfacial problems associated with a plastic molded LCP image sensor package using a standard LCP material. Adhesion of this material to the leadframe is non-optimum, and dye inserted in the cavity will leak through the LCP/Leadframe interface. This package with conventional plastic material will not meet the applicable industry standard. (MIL-STD-883, Test Condition D: Gross Leak using a Dye Penetrant).

For comparison, in a package such as shown herein subjected to the same dye leak test, the dye penetrant did not leak through the LCP/leadframe interface, allowing this package to meet the MIL-STD-883 standard.

Figure 11:
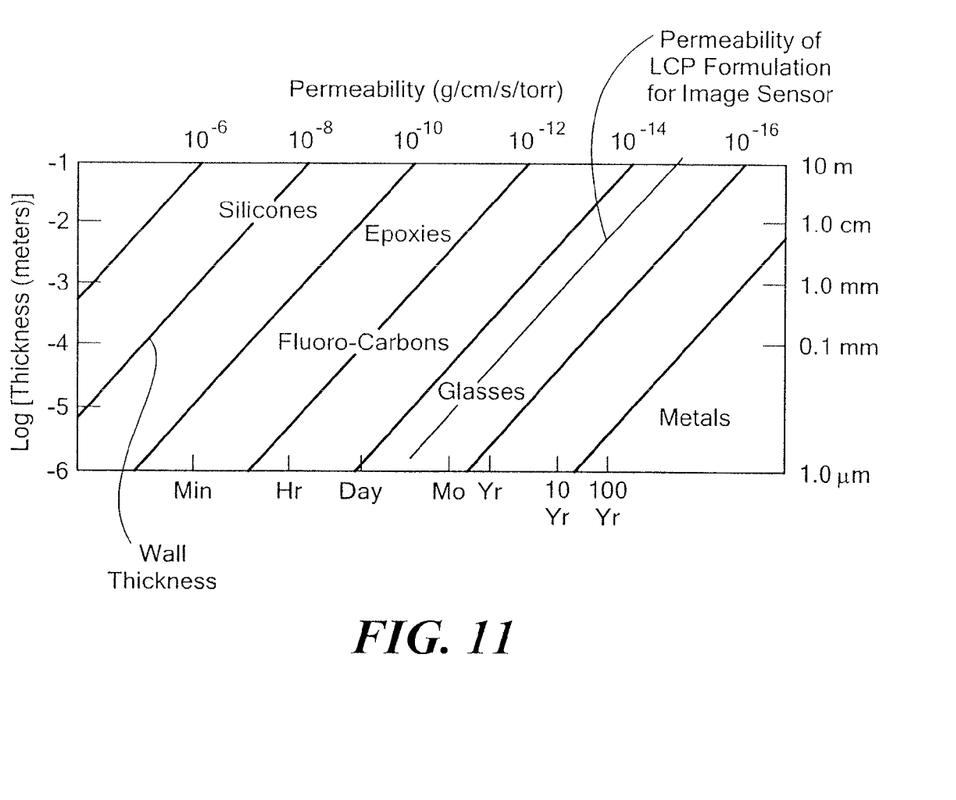
FIG. 11 is a graph illustrating the permeability of packaging materials.

FIG. 11 shows several materials which are used in semiconductor packaging. In non-hermetic packages, polymers are used which have a permeability such that fluids and moisture can penetrate easily. In hermetic packaging, materials are used which are relatively impervious to fluids and moisture. As can be seen, the permeability of the "non-hermetic" materials is high, such that fluids and moisture can relatively easily penetrate the package. Glass, ceramic, and metal have relatively low permeability, allowing for them to be suited for hermetic packaging. Also shown is the measured permeability of the LCP formulation used for the image sensor package of the present invention. The permeability of the LCP formulation is equivalent to glass, making it most suitable for "hermetic" packaging.

As the package constructed in accordance with the invention is hermetically sealed, the package can be employed to house components such as LEDs which may include a liquid or gel filled interior. For such purposes, the present package avoids leakage of the gel which can occur in conventional packages which are not adequately sealed.

While the invention has been described for use in an image sensor package, the invention is not limited to image sensor packages or optical packages but is useful for providing a plastic package for containing other semiconductor, electric or electrical components, devices or circuits. For applications where a glass lid is not needed, the lid assembly can be molded in one piece which includes the lid or cover portion and surrounding frame which is bondable to the package frame. In addition, the interfacial layer of the present invention is not limited to use between a leadframe and a plastic frame but is more generally useful as an interfacial layer between a metal and a plastic in other than circuit or device packages. Accordingly, the invention is not to be limited by the embodiments shown and described but is to embrace the full spirit and scope of the accompanying claims.

What is claimed is:

1. A method of forming a hermetic seal between a metal element and a high temperature plastic element, the method comprising the steps of:

oxidizing a surface of the metal element by reacting the surface with a chemical oxidizer solution at a temperature of about 212-216° F. for greater than 10 minutes, whereby a first oxide layer consisting essentially of cuprous oxide is formed on the metal surface, and whereby substantially simultaneously a second oxide layer consisting essentially of cupric oxide with an acicular structure is formed on the first oxide layer; and applying a high temperature plastic material onto the second oxide layer to form the plastic element.

2. The method of claim 1, wherein the metal element has a copper surface at least in the area bondable to the plastic element.

3. The method of claim 1, wherein the metal element consists essentially of copper or a copper alloy.

4. The method of claim 1, wherein the high temperature plastic material is a liquid crystal polymer (LCP) material.

5. The method of claim 4, wherein the LCP material is a polymer formed from one or more monomeric units selected from the group consisting of hydroquinone, terephthalic acid, isophthalic acid, 2,6-naphthalene dicarboxylic acid, 4-hydroxybenzoic acid, bisphenol, and hydroxynaphthoic acid.

6. The method of claim 1, wherein the plastic material comprises one or more types of filler particles selected from the group consisting of talc, glass fiber, milled glass, and flake glass.

7. The method of claim 6, wherein the filler particles are in the range of 10-50% by weight of the plastic material.

8. The method of claim 6, wherein at least some of the filler particles, have a particle size in the range of about 50-350 microns.

9. The method of claim 6, wherein at least some of the filler particles are of nano size.

10. The method of claim 1, wherein the first and second oxide layers are applied to a portion of the surface of the metal element.

11. The method of claim 1, wherein the first and second oxide layers are applied to the entire surface of the metal element.

12. The method of claim 1, further comprising the step of removing the exposed portions of the first and second oxide layers from the metal element after applying the plastic material.

13. The method of claim 1, wherein the plastic material is applied by a molding process.

14. The method of claim 13, wherein the molding process comprises injection molding.

15. The method of claim 1, wherein the step of oxidizing is performed by reacting with the chemical oxidizer solution for about 20 minutes.

16. The method of claim 1, wherein the LCP material has a melting temperature greater than about 300° C.

17. The method of claim 1, wherein the plastic material has a coefficient of thermal expansion (CTE) compatible with that of the metal element.

18. The method of claim 17, wherein the CTE of the plastic material is in the range of about 6-25 ppm/° C.

19. The method of claim 1, wherein the chemical oxidizer solution is an alkaline solution.

20. The method of claim 1, wherein the first oxide layer and the second oxide layer together have a thickness of about 1-10 microns.

21. The method of claim 1, wherein the seal withstands a dye gross leak test according to standard MIL-STD-883, Test Condition D.

* * * * *